(12) United States Patent
Bekele et al.

(10) Patent No.: US 9,325,277 B1
(45) Date of Patent: Apr. 26, 2016

(54) VOLTAGE CONTROLLED OSCILLATOR INCLUDING MUGFETS

(71) Applicant: Xilinx, Inc., San Jose, CA (US)

(72) Inventors: Adebabay M. Bekele, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/571,805

(22) Filed: Dec. 16, 2014

(51) Int. Cl.
*H03B 5/12* (2006.01)

(52) U.S. Cl.
CPC .......... *H03B 5/1253* (2013.01); *H03B 5/1215* (2013.01); *H03B 5/1265* (2013.01); *H03B 5/1278* (2013.01); *H03B 2201/0208* (2013.01); *H03B 2201/031* (2013.01)

(58) Field of Classification Search
CPC .. H03B 5/1215; H03B 5/1212; H03B 5/1253; H03B 5/1265; H03B 2200/0062; H03B 2201/0208; H03B 2201/03; H03B 2201/031; H03B 5/1275; H03B 5/1278; H03B 5/1293
USPC ................................ 331/117 R, 117 FE, 167
See application file for complete search history.

(56) References Cited

U.S. PATENT DOCUMENTS

| | | | |
|---|---|---|---|
| 7,477,113 B1 | 1/2009 | Hughes | |
| 7,764,127 B2 * | 7/2010 | Sun ......................... | H03L 7/099 331/117 FE |
| 8,076,982 B2 * | 12/2011 | Suzuki ................. | H03B 5/1228 331/109 |
| 8,269,566 B2 * | 9/2012 | Upadhyaya .......... | H03B 5/1262 331/117 R |
| 8,604,889 B2 * | 12/2013 | Duperray ............. | H03B 5/1278 331/117 FE |
| 8,629,732 B2 * | 1/2014 | Trivedi .................... | H03L 7/099 331/117 FE |
| 8,928,382 B1 * | 1/2015 | Ler ..................... | H01L 29/7855 327/237 |
| 2007/0247237 A1 | 10/2007 | Mohammadi | |
| 2009/0231051 A1 | 9/2009 | Tokuyama | |
| 2009/0309162 A1 | 12/2009 | Baumgartner | |
| 2010/0187575 A1 | 7/2010 | Baumgartner | |

OTHER PUBLICATIONS

Soorapanth, T., et al., "Analysis and Optimization of Accumulation-Mode Varactor for RF ICs", Center for Integrated Systems, , Stanford University, 1998 Symposium on RFIC Virtual Journal, IEEE, Jun. 11-13, 1998, pp. 1-20, Honolulu, HI.

* cited by examiner

*Primary Examiner* — Ryan Johnson
(74) *Attorney, Agent, or Firm* — W. Eric Webostad

(57) ABSTRACT

Voltage-controlled oscillation is described. In an apparatus therefor, an inductor has a tap and has or is coupled to a positive-side output node and a negative side output node. The tap is coupled to receive a first current. A coarse grain capacitor array is coupled to the positive-side output node and the negative side output node and is coupled to respectively receive select signals. A varactor is coupled to the positive-side output node and the negative side output node and is coupled to receive a control voltage. The varactor includes MuGFETs. A transconductance cell is coupled to the positive-side output node and the negative side output node, and the transconductance cell has a common node. A frequency scaled resistor network is coupled to the common node and is coupled to receive the select signals for a resistance for a path for a second current.

18 Claims, 7 Drawing Sheets

VOLTAGE CONTROLLED OSCILLATOR INCLUDING MUGFETS

FIELD OF THE INVENTION

The following description relates to integrated circuit devices ("ICs"). More particularly, the following description relates to a voltage controlled oscillator including MuGFETs for an IC.

BACKGROUND

Integrated circuits have become more "dense" over time, i.e., more logic features have been implemented in an IC of a given size. Part of this increase in density has led to development of a multigate device, such as a multiple gate field-effect transistor ("MuGFET"). A form of a MuGFET is a multiple independent gate field-effect transistor ("MIGFET"). Forms of MuGFETs may be planar or nonplanar. For example, a planar double-gate transistor and a Flexfet are planar forms of MuGFETs, and a FinFET and a Tri-gate or 3D transistor are nonplanar forms of MuGFETs. For purposes of clarity by way of example and not limitation, the following description is in terms of FinFETs, where FinFET generally refer to any fin-based, multigate transistor architecture without regard to the number of gates other than there are at least two gates.

Use of FinFET technology in an inductance-capacitance ("LC") voltage controlled oscillator ("VCO") presents a challenge for achieving a wide tuning range. Generally, this may be due to reliability and gate work function issues. Along those lines, a capacitance-voltage ("CV") curve of a varactor, such as for example an NMOS varactor, may be shifted to higher voltages due to FinFET technology work function of such a varactor.

Hence, it is desirable and useful to provide a wideband NMOS LC VCO that overcomes one or more of these issues.

SUMMARY

An apparatus relates generally to a voltage-controlled oscillation. In such an apparatus, an inductor has a tap and has or is coupled to a positive-side output node and a negative side output node. The tap is coupled to receive a first current. A coarse grain capacitor array is coupled to the positive-side output node and the negative side output node and is coupled to respectively receive select signals. A varactor is coupled to the positive-side output node and the negative side output node and is coupled to receive a control voltage. The varactor includes MuGFETs. A transconductance cell is coupled to the positive-side output node and the negative side output node, and the transconductance cell has a common node. A frequency scaled resistor network is coupled to the common node and is coupled to receive the select signals for a resistance for a path for a second current.

A system relates generally to an integrated circuit device. In such a system, a controller is coupled to receive a frequency and amplitude swing input signal. A voltage controlled oscillator is coupled to the controller to receive selection signals and a control voltage. The voltage controlled oscillator includes an inductor. The inductor has a tap and has or is coupled to a positive-side output node and a negative side output node. The tap is coupled to receive a first current. A coarse grain capacitor array is coupled to the positive-side output node and the negative side output node and is coupled to respectively receive the select signals. A varactor is coupled to the positive-side output node and the negative side output node and is coupled to receive the control voltage. The varactor includes MuGFETs. A transconductance cell is coupled to the positive-side output node and the negative side output node. The transconductance cell has a common node. A frequency scaled resistor network is coupled to the common node and is coupled to receive the select signals for resistance of a path for a second current.

A method relates generally to voltage-controlled oscillation. In such a method, a first current is received by a tap of an inductor. The inductor is coupled to or has a positive-side output node and a negative side output node. A capacitance is selected from a coarse grain capacitor array coupled to the positive-side output node and the negative side output node. The coarse grain capacitor array is coupled to respectively receive select signals to select the capacitance. A control voltage is set for a varactor coupled to the positive-side output node and the negative side output node. The varactor includes MuGFETs. Transconductance is provided via a transconductance cell coupled to the positive-side output node and the negative side output node. The transconductance cell has a common node. A resistance is selected from a frequency scaled resistor network coupled to the common node for a path for a second current. The frequency scaled bias current source-resistor network is coupled to receive the select signals to select the resistance for the path. An oscillating signal is output.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
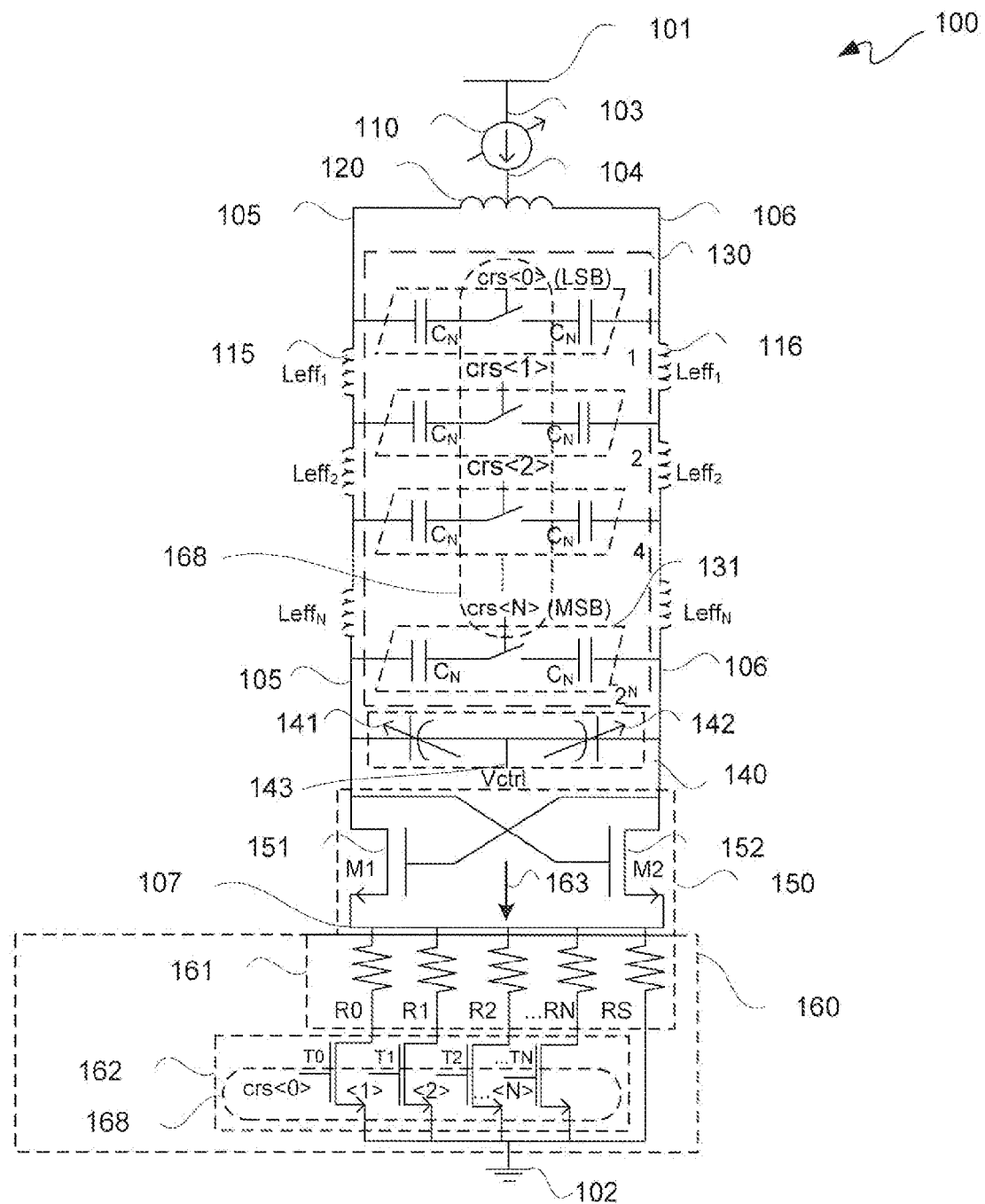
FIG. 1 is a schematic diagram depicting an exemplary wideband voltage controlled oscillator ("VCO").

In the following description, numerous specific details are set forth to provide a more thorough description of the specific examples described herein. It should be apparent, however, to one skilled in the art, that one or more other examples and/or variations of these examples may be practiced without all the specific details given below. In other instances, well-known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

An LC VCO is a resonant oscillator whose frequency depends on effective inductance ("Leff") and effective capacitance ("Ceff"). Conventionally, an LC oscillator has a fixed inductance, while capacitance is tuned via FET varactor. This tuning may be used to achieve a relatively narrow frequency tuning range.

In contrast, a wideband LC VCO is formed using a switching bank of coarse capacitors in combination with a finely tunable varactor having a fixed inductance. Coarse capacitor tuning banks can be formed using metal-oxide-metal ("MoM") capacitors, namely a "MoM capacitor network", in conjunction with a series FET switch. Tuning range of an LC VCO may limit the range of data rates in serializer-deserializer ("SERDES"), radio-frequency ("RF"), or other data communication applications.

A maximum frequency tuning range may be subject to a maximum effective capacitance ("Cmax") to minimum effective capacitance ("Cmin") ratio ("Cmax/Cmin"). This ratio may be influenced by capacitance of such a MoM capacitor network, as well as capacitance of a fine capacitive network of finely tunable varactors. Additional factors in this Cmax/Cmin ratio may include any parasitic capacitance of an LC tank circuit, including without limitation any buffer load capacitance, and/or a transconductance ("$g_m$") of a cross-coupled transistor load. Therefore, a challenge in forming a wideband LC VCO is minimizing Cmin for a desired Cmax for a SERDES, RF, or other data communication application.

For formation of a wideband LC VCO, a frequency-dependent biased LC VCO is described. By "wideband," it is generally meant approximately at least a 20% frequency tuning range. For example this may be at least approximately a 20% frequency tuning range of approximately a 10 GHz VCO. However, this may vary from application to application. For example, three VCOs may be used with overlap between them to provide a frequency range, such as for example approximately 8 GHz to 17 GHs with each of such VCO covering approximately a 20% to 30% of frequency tuning range. For example, such an LC VCO may be used for a SERDES application without compromising frequency tuning range and/or degrading the quality factor of a LC tank circuit. Such LC VCOs may facilitate providing low jitter phase-locked loops ("PLLs").

As described below in additional detail, open loop programmable resistors in sync with current biasing containing frequency information is used to ensure reliable VCO operation. Strategic layout via placement of coarse capacitors may be used in such LC VCO to take advantage of a distributed L and C effect. Such placement may be used to maximize or otherwise increase a frequency tuning range of an LC oscillator to facilitate providing wideband capability. Programmable current biasing may be used for providing optimal or at least improved jitter performance over an entire frequency tuning range and/or to extend frequency tuning range by exploiting bias dependent parasitic capacitances.

With the above general understanding borne in mind, various configurations for a wideband LC VCO are generally described below.

FIG. 1 is a schematic diagram depicting an exemplary wideband LC VCO 100. LC VCO 100 is a PMOS current source ("top-based") architecture; however, in another configuration positions of a bias current and a programmable resistance may be swapped for an NMOS current source ("bottom-based") architecture. LC VCO 100 may be coupled between a supply voltage node 101 and a ground node 102. LC VCO 100 may include a programmable current source 110, an inductor 120, a coarse grain capacitor ("cap") array 130, a varactor 140, a cross-coupled transconductance ("$g_m$")

cell 150, and a resistor network 160. Resistor network 160 includes a bias current path selection network, namely an array of transistors ("transistor array") 162, and an array of resistors ("resistor array") 161.

With a single pair of cross-coupled transistors 151 and 152 to provide cross-coupled transconductance cell 150, margin or headroom may be sufficient to handle typical variations associated with scaled-down technologies, such as 20 nm FinFET and smaller minimum dimension transistor lithographies. A programmable current bias may be provided by a frequency scaled bias current source, namely programmable current source 110, and resistor network 160, which may be used to compensate for LC tank oscillator swing variation across a wide range of tunable frequencies.

Inductor 120 may have a distributed inductance, as described below in additional detail. A reference current ("Iref") 103 may be provided as an input to programmable current source 110 to source therefrom an output current ("Iout") 104. Output current 104 may be provided to a control port or tap of inductor 120.

Such programmable bias current Iout 104 from programmable current source 110 may further add to providing a wideband frequency tuning range of LC VCO 100 by exploiting bias dependent parasitic capacitances, such as of cells 131. In other words, parasitic capacitances may be greater or have greater effect with larger values of Iout 104. Additionally, an Ibias current 163 may be related to Iout 104.

Current Iout 104 may be provided to a tap of inductor 120. A wide frequency tuning range for LC VCO 100 may be provided with a fixed tap inductor 120, including without limitation a fixed single tap inductor 120. In other words, inductor 120 of LC VCO 100 does not have to be a tap switchable inductor to provide a wideband frequency tuning range.

In this example, coarse grain cap array 130 is formed of 0 to N capacitor unit cells 131, for N a positive integer greater than one, to provide a coarse granularity in capacitive steps from one capacitor unit cell 131 to the next. Along those lines, coarse capacitor unit cells 131 may be numbered from $2^0$ to $2^N$ from a Least Significant Bit ("LSB") to a Most Significant Bit ("MSB") corresponding to bits crs<0> to crs<N>. Bits crs<0> to crs<N> may be a form of select signals or selects, which may respectively be provided to control gates of capacitor unit cells 131.

In this example, each capacitor unit cell 131 is composed of MoM caps and NMOS transistor MuGFET switches, as described below in additional detail. However, in other implementations, other types of capacitors and/or other types of transistors may be used, such as for example other types of conductor-insulator-conductor capacitors, other polarity transistors, and/or other types of transistors. Additionally, band overlap, namely a percentage of frequency overlap between a band X and a band X+1, may be provided. To have a band overlap above a certain percentage, such as greater than approximately 20% for example, capacitor size of capacitor unit cells 131 may vary. For example, bit crs<0> might control 130 fingers of MoM cap, and bit crs<N> might control 120 fingers of a MoM cap. This is just an example for purposes of clarity, and accordingly these or other values may be used in other examples.

Adjustable capacitors ("caps") 141 and 142 of varactor 140 may in combination provide an accumulation mode N-cap varactor. Such adjustable caps 141 and 142 may provide fine grain capacitance adjustment in comparison to capacitance steps between capacitor unit cells 131. Varactor 140 may be conventional, and so varactor 140 is not described in unnecessary detail herein.

Cross-coupled transconductance cell 150 may be formed of cross-coupled transistors 151 and 152, which in this example are respective NMOS transistors. However, the technology described herein may be implemented with PMOS cross-coupled transistors to provide a cross-coupled transconductance cell 150. Moreover, in other implementations, other types of transistors may be used. NMOS transistors 151 and 152 may be planar transistors or MuGFETs, such as FinFETs.

Inductor 120 may be coupled to or have a positive-side output node 105 and a negative-side output node 106, as described below in additional detail. Each of capacitor unit cells 131 of coarse grain cap array 130 may be coupled to positive-side output node 105 on one output side and negative-side output node 106 on another output side of each cell 131.

Along those lines, each of capacitor unit cells 131 may be associated with a contribution to an overall effective inductance, as generally indicated by N inductors 115 and 116 respectively on a positive-side output node 105 and a negative-side output node 106. Such inductors 115 are not actual components, rather such inductors 115 represent a distributed inductance along nodes 105 and 106, where distributed inductance may be of inductor 120. Accordingly, inductors 115 may be used to model or represent such distributed inductance as respective inductors coupled in series along output nodes 105 and 106 in respective association with capacitor unit cells 131.

Varactor 140 may be coupled to a positive-side output node 105 on one output side and a negative-side output node 106 on another output side of varactor 140. Inputs of adjustable capacitors 141 and 142 may be commonly coupled to receive a control voltage 143. A single control voltage 143 may be used to adjust capacitance of each of adjustable capacitors 141 and 142 for fine tuning adjustment of such capacitances. Adjustable capacitors 141 and 142 may be formed using a MuGFET, such as a FinFET, semiconductor process technology, such as a semiconductor process node equal to or less than 20 nm.

Cross-coupled transconductance cell 150 may be coupled to provide transconductance between nodes 105 and 106. A drain node of NMOS transistor 151 and a gate node of NMOS transistor 152 of cross-coupled transconductance cell 150 may be coupled to positive-side output node 105, and a drain node of NMOS transistor 152 and a gate node of NMOS transistor 151 of cross-coupled transconductance cell 150 may be coupled to negative-side output node 106. Source nodes of NMOS transistors 151 and 152 may be commonly coupled to a resistance load node 107 of frequency scaled resistor network 160.

Resistor network 160 may be coupled between resistance load node 107 and ground node 102. More particularly, first ends of resistors R0 through RN of resistor array 161 may be commonly coupled to resistance load node 107. A first end of a source resistor ("RS") of resistor array 161 may be commonly coupled with first ends of resistors R0 through RN at resistance load node 107, and a second end of such source resistor RS may be coupled to ground node 102 to ensure that such source resistance is present even when all of the transistors T0 through TN of bias current path selection network, such as transistor array 162, are in an off or substantially nonconductive state. Transistors T0 through TN of bias current path selection network, such as transistor array 162, may be formed using a MuGFET, such as a FinFET, semiconductor process technology, such as a semiconductor process node equal to or less than 20 nm.

Second ends of resistors R0 through RN of resistor array 161 may be respectively coupled to drain nodes of transistors T0 through TN of bias current path selection network, such as transistor array 162. Source nodes of transistors T0 through TN of bias current path selection network, such as transistor array 162, may be commonly coupled to ground node 102. Resistor network 160 may be used to provide a path to ground of a bias current, generally indicated as Ibias 163 from resistance load node 107 to ground node 102. A frequency scalable bias current may be provided by programmable current source 110, and resistor network 160 may provide a frequency scalable bias voltage at load node 107. Resistor network 160 may have some independent programmability via selection signals crs<0> through crs<N> provided to transistor array 162, which may be independent of programming of programmable current source 110.

An LC tank oscillator is part of LC VCO 100. An LC tank oscillator, which is coupled between a supply voltage and ground, generally includes: an inductance, such as provided by inductor 120 in this example; a capacitance, such as provided by varactor 140 in this example; a transconductance, such as provided by transconductance cell 150 in this example; and a current source, such as provided by frequency-scaled resistor network 160 in this example. Even though in this example, inductance, capacitance, and transconductance are coupled in parallel, in another configuration separate RLC networks may be commonly coupled to a supply voltage and respectively coupled to a transconductance circuit. In another configuration, inductor 120 may be two separate inductors with a center tap or node. A frequency of oscillation of such an LC tank oscillator is given by Equation (1), as follows:

$$f_{osc}=1/(2\pi(Leff*Ceff)^{1/2}), \quad (1)$$

where Leff is an effective inductance of such LC tank oscillator, and Ceff is an effective capacitance in such LC tank oscillator. A voltage oscillation swing of an analog output of such LC tank oscillator ("tank voltage swing") is a function of a bias current Ibias 163 and an effective parallel resistance ("Rp") of such LC tank oscillator. Parallel resistance Rp is effectively a parallel resistance of such LC tank oscillator at resonance frequency. Along those lines, two sets of a parallel resistance Rp, an inductance of inductor 120, and an adjustable capacitance of varactor 140 may be coupled in parallel with one another, namely one set for node 105 and one set for node 106, as an equivalent model to coarse grain cap array 130, inductor 120, and varactor 140 of FIG. 1. At resonance frequency, a negative resistance of a gm cell 150 may be equivalent to Rp, and this parallel resistance Rp may be proportional to Qloaded*Wo*L, where Wo equals $2\pi f$ for f the resonance frequency of such LC VCO at an Leff and Q quality factor of such LC tank oscillator at resonance. Both such bias current Ibias 163 and effective parallel resistance Rp may have an effect on LC tank oscillator voltage swing. For an LC tank oscillator quality factor ("Qloaded") and a frequency ($\omega$) of operation of such LC tank oscillator, tank voltage swing as may be mathematically expressed as follows in Equation (2):

$$\text{Tank voltage swing}=Ibais*Rp=Ibais*Qloaded*\omega*L \quad (2),$$

where inductance L is an effective inductance Leff. An LC tank oscillator quality factor is a frequency dependent variable, and so LC tank oscillator parallel resistance Rp is nonlinear function of frequency ($\omega$).

A resultant tank voltage swing may not be constant over a wide frequency range that LC VCO 100 is to cover, as resultant tank voltage swing may vary from frequency-to-frequency. To keep a resultant tank voltage swing constant or at least substantially constant, Ibias 163 may be scaled inversely proportional to parallel resistance Rp using selection signals 168, such as coarse selection bits ("crs<0>" through "crs<N>"), as respectively provided to selection transistors of programmable current source 110. Additionally, selection signals 168, such as bits crs<0> through crs<N> respectively provided, may be respectively provided to control selection of $2^0$ through $2^N$ capacitor unit cells 131, namely a binary scale of coarse capacitor unit cells 131. Furthermore, such selection signals 168, such as bits crs<0> through crs<N>, may be respectively provided to gate nodes of transistors T0 through TN of transistor array 162 to select which, if any or all, of corresponding resistors R0 through RN of resistor array 161 are to be used in parallel with resistor RS to provide a constant voltage at node 107.

Generally, resistor network 160 may be thought of as a frequency scaled resistor when such resistor network 160 is multiplied by a frequency scalable bias current of programmable current source 110. As such, resistor network 160 may provide a constant voltage at load node 107.

Resistors R0 through RN may be progressively or incrementally scaled. Thus, for incrementally scaled resistors R0 through RN, each of resistors R0 through RN may generally be of a same resistance, along the lines of thermometer coding. For progressively scaled resistors R0 through RN, resistance of resistor R0 may be substantially smaller than resistance of resistor RN. For example, resistances of resistors R0 through RN may binarily be increased, along the lines of binary coding. It should be understood that a parallel resistance Rp is provided by selection of one or more of resistors R0 through RN, in parallel with one another, and in parallel with resistor RS. Additionally, a combination of incremental and progressive scaling may be used in providing resistors R0 through RN, where a first portion of resistors R0 through RN generally have a same resistance, and where a second portion or remainder of resistors R0 through RN are binarily scaled up from such individual same resistance in such first portion.

Optionally, transistors T0 through TN may be progressively or incrementally scaled. Thus, for incrementally scaled transistors T0 through TN, each of transistors T0 through TN may generally be of a same size, along the lines of thermometer coding. For progressively scaled transistors T0 through TN, size of transistor T0 may be substantially smaller than size of transistor TN. For example, sizes of transistors T0 through TN may binarily be increased, along the lines of binary coding. It should be understood that parallel current paths are provided by selection of one or more of transistors T0 through TN, in parallel with one another, and in parallel with a current path through resistor RS. Larger transistors may allow more current to pass than smaller transistors of transistors T0 through TN. Additionally, a combination of incremental and progressive scaling may be used in providing transistors T0 through TN, where a first portion of transistors T0 through TN each generally have a same size, and where a second portion or remainder of transistors T0 through TN are binarily scaled up from such individual same size in such first portion.

Figure 2:
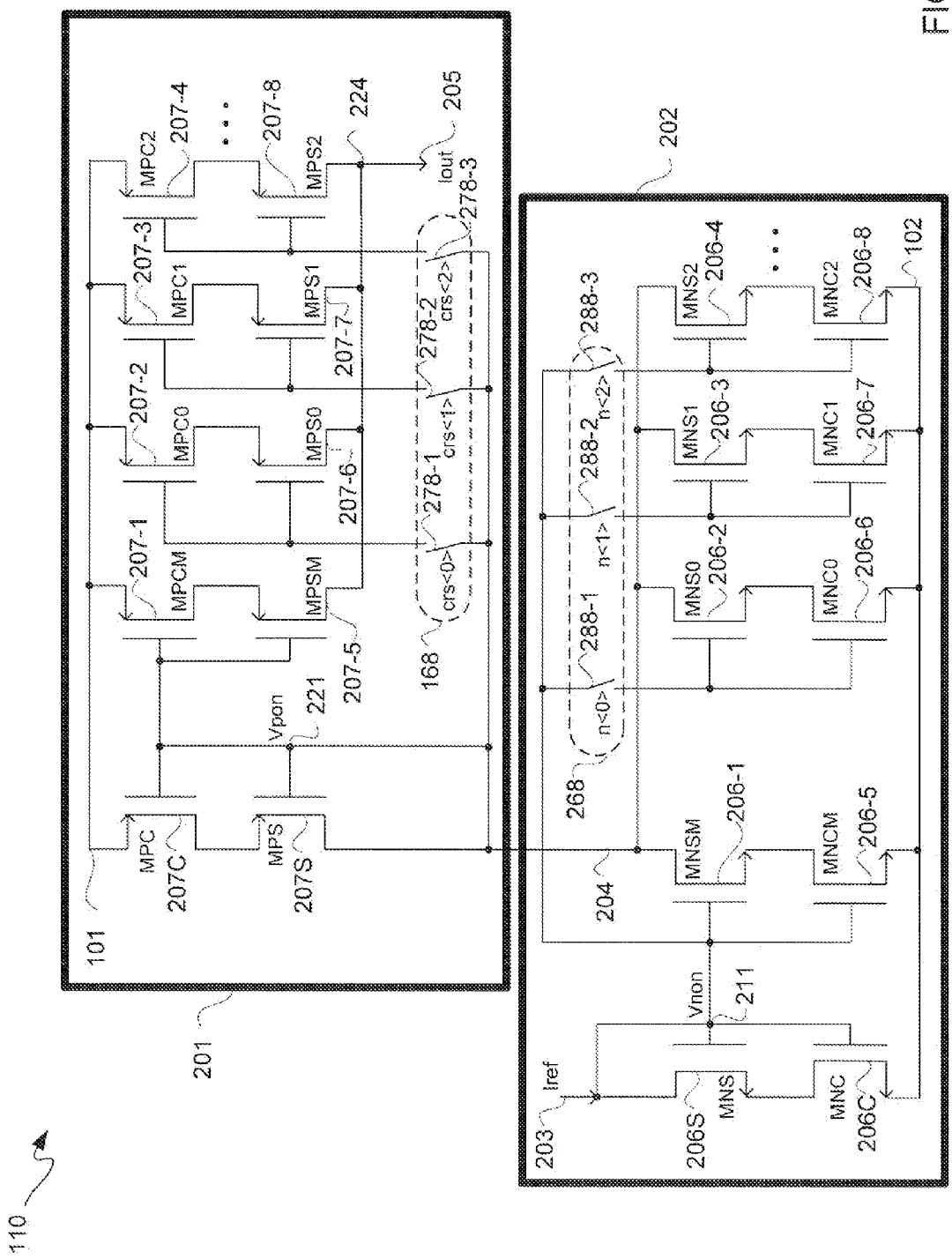
FIG. 2 is a schematic diagram depicting an exemplary programmable current source.

FIG. 2 is a schematic diagram depicting an exemplary programmable current source 110. Programmable current source 110 includes a PMOS-side voltage tuning network 201 and an NMOS-side voltage tuning network 202. A reference current ("Iref") 203 is provided as an input to NMOS-side voltage tuning network 202. PMOS-side voltage tuning network 201 is coupled to NMOS-side voltage tuning network 202 at a bias node 204. An output current ("Iout") 205 may be sourced from PMOS-side voltage tuning network 201.

NMOS-side voltage tuning network 202 includes "MN" transistors 206S and 206C, as well as MN transistors 206-1 through 206-8 ("206"), and PMOS-side voltage tuning network 201 includes "MP" transistors 207S and 207C, as well as MP transistors 207-1 through 207-8 ("207"). Transistors of networks 201 and 202 may include MuGFETs, such as FinFETs, or other types of transistors.

Iref 203, as well as a bias voltage associated therewith, is provide to a drain node of transistor MNS 206S and to a common gate node of transistors MNC 206C, MNS 206S, MNSM 206-1, and MNCM 206-5, where "MN" stands for an NMOS transistor. A source node of transistor MNS 206S is commonly coupled with a drain node of transistor MNC 206C, and a source node of transistor MNSM 206-1 is coupled to a drain node of transistor MNCM 206-5.

Gates of transistors MNC 206C, MNCM 206-5. MNS 206S, and MNSM 206-1 are biased with an NMOS bias voltage ("Vnon") 211. NMOS bias voltage 211 is a bias voltage to hold transistors MNC 206C, MNCM 206-5. MNS 206S, and MNSM 206-1 in an on or at least substantially conductive state.

Source nodes of transistors MNC 206C, MNCM 206-5, and MNC0 206-6 through MNC2 206-8 are commonly coupled to a ground node 102. A drain node of transistor MNSM 206-1 is coupled to bias node 204. Accordingly, transistors MNS 206S, MNSM 206-1, MNC 206C, and MNCM 206-5 are coupled to provide a minimum bias circuit which provides at least a minimum bias to bias node 204, as well as providing a generally constant voltage Vnon 211. However, this bias provided to bias node 204 may be adjusted by selection of one or more pairs of transistors, as described below in additional detail.

Drain nodes of transistors MNC0 206-6 through MNC2 206-8 are respectively coupled to source nodes of transistors MNS0 206-2 through MNS2 206-4, and drain nodes of transistors MNS0 206-2 through MNS2 206-4, as well as a drain node of transistor MNSM 206-1, are commonly coupled to bias node 204. Gate nodes of transistors MNS0 260-2 through MNS2 206-4 are respectively commonly coupled with gate nodes of transistors MNC0 206-6 through MNC2 206-8. Such common gate nodes of such pairs of transistors MNS0 206-2 through MNS2 206-4 and MNC0 206-6 through MNC2 206-8, respectively, may be respectively and selectively coupled to bias node 204 responsive to respective switches 288-1 through 288-3 controlled by selection signals 268, such as selection bits n<0> through n<2>, respectively. These switches 288 may be pass-gated transistors, configuration memory cells, or other circuits to selectively or programmably set states.

Accordingly, transistors 206-2 through 206-4 respectively form pairs of NMOS transistors with transistors 206-6 through 206-8. There may be N transistor pairs in network 201, as well as network 202 as described below in additional detail, for N a positive integer greater than 0. Even though in this example N is equal to 3, in other examples N may be less than or greater than 3.

Pairs of transistors MNS0 206-2 through MNS2 206-4 and MNC0 206-6 through MNC2 206-8, respectively, may be weighted, such as with progressive sizing, to progressively adjust a bias voltage applied to bias node 204. Optionally, pairs of transistors MNS0 206-2 through MNS2 206-4 and MNC0 206-6 through MNC2 206-8, respectively, may have generally the same size to progressively adjust a bias voltage applied to bias node 204.

A bias voltage sourced from bias node 204 may be provided to a drain node of transistor MPS 207S and to a common gate node of transistor MPS 207S, MPC 207C, MPCM 207-1, and MPSM 207-5. A source node of transistor MPS 207S is commonly coupled with a drain node of transistor MPC 207C.

Gates of transistors MPS 207S, MPC 207C, MPCM 207-1, and MPSM 207-5 are commonly biased with a PMOS bias voltage ("Vpon") 221, namely a bias voltage to hold those transistors in an on or at least substantially conductive state.

Gate nodes of transistors MPC0 207-2 through MPC2 207-4 are commonly coupled with gate nodes of transistors MPS0 207-6 through MPS2 207-8, respectively, to form respective pairs of PMOS transistors thereof. Such common gate nodes of such pairs of transistors MPC0 207-2 through MPC2 207-4 and MPS0 207-6 through MPS2 207-8, respectively, may be respectively and selectively coupled to bias node 204 responsive to respective switches 278-1 through 278-3 controlled by selection signals 168, such as selection bits crs<0> through crs<2>, respectively. These switches 278 may be pass-gated transistors, configuration memory cells, or other circuits to selectively or programmably set open or closed states.

Source nodes of transistors MPC 207C, MPCM 207-1, and MPC0 207-2 through MPC2 207-4 are commonly coupled to a supply node 101. A source node of transistor MPSM 207-5 is commonly coupled with a drain node of transistor MPCM 207-1. A drain node of transistor MPSM 207-5 is coupled to an output node 224 from which Iout 205 may be sourced. Accordingly, transistors MPS 207S, MPSM 207-5, MPC 207C, and MPCM 207-1 are coupled to provide a minimum bias circuit which provides at least a minimum bias current Iout 205 to an output node 224, as well as providing generally a constant bias voltages Vpon 221. However, this bias output current Iout 205 provided to output node 224 may be adjusted by selection of one or more of pairs of NMOS transistors MPC0 207-2 through MPC2 207-4 and MPS0 207-6 through MPS2 207-8, respectively, as described below in additional detail.

Drain nodes of transistors MPC0 207-2 through MPC2 207-4 are respectively coupled to source nodes of transistors MPS0 207-6 through MPS2 207-8, and drain nodes of transistors MPS0 207-6 through MPS2 207-8 are commonly coupled to output node 224. Gate nodes of pairs of NMOS transistors MPC0 207-2 through MPC2 207-4 and MPS0 207-6 through MPS2 207-8, respectively, may be selectively and respectively coupled responsive to respective switches 278 controlled by coarse selection signals 168, such as selection bits crs<0> through crs<2>. Accordingly, any one or more of N pairs of PMOS transistors may be selectively added into to provide Iout 205. Even though in this example N is equal to 3, in other examples N may be greater than 3. Accordingly, there may be N pairs of NMOS transistors and N pairs of corresponding PMOS transistors to provide as respective pairs of current sources through opposite polarities. Thus, selection signals 168 and 268 in this example may be respectively provided to sets of switch transistors 278 and 278 of opposite polarities.

Pairs of PMOS transistors MPC0 207-2 through MPC2 207-4 and MPS0 207-6 through MPS2 207-8, respectively, may be weighted, such as with progressive sizing, to progressively adjust a bias current Iout 205. Optionally, pairs of PMOS transistors MPC0 207-2 through MPC2 207-4 and MPS0 207-6 through MPS2 207-8, respectively, may have generally the same size to progressively adjust a bias current Iout 205 applied to output node 224.

Figure 3:
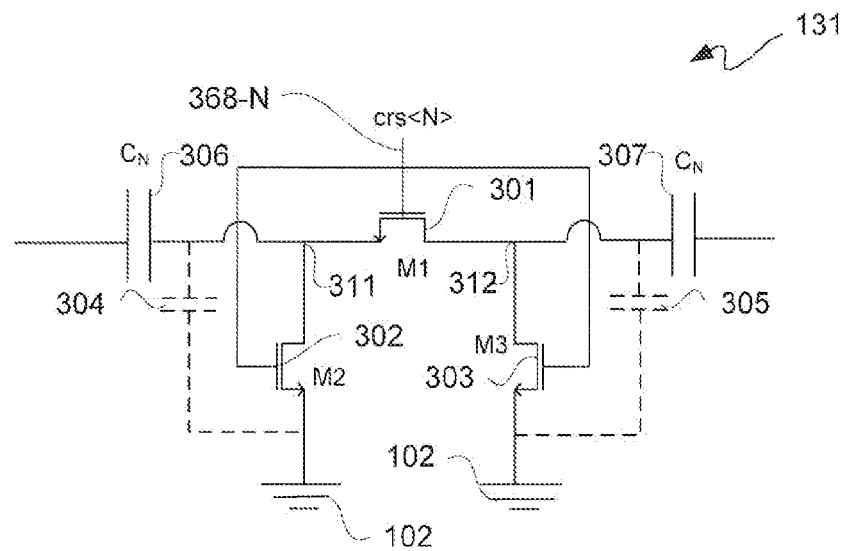
FIG. 3 is a schematic diagram depicting an exemplary capacitor unit cell.

FIG. 3 is a schematic diagram depicting an exemplary capacitor unit cell 131. Capacitor unit cell 131 in this example is coupled for receipt of a selection signal 168-N, such as an MSB crs<N>; however, the following description is applicable to any of capacitor unit cells 131 of FIG. 1, as each of such capacitor unit cells 131 may include the same components though with same or different sizes of capacitors.

Transistors 301 through 303 are a grouping or group of NMOS MuGFETs, such as FinFETs, in this example. A gate node of each of transistors 301 through 303 in such group is coupled to receive bit crs<N> as a select signal 168-N. Gates of transistors 301 through 303 may be commonly coupled to receive such select signal 168-N. Thus, all of transistors 301 through 303 may be transitioned from an on state to an off state, and vice versa, responsive to a same select signal 168-N.

A drain node of transistor 302 may be coupled to a source, or drain, node 311 of transistor 301, and a drain node of transistor 303 may be coupled to a drain, or source, node 312 of transistor 301. Source nodes of transistors 302 and 303 may be coupled to a ground node 102. Capacitors 306 and 307, which may represent respective capacitor banks, may respectively be coupled at nodes 311 and 312. Along those lines, a first plurality of MoM capacitors may be coupled in parallel to provide capacitor 306, and a second plurality of MoM capacitors may be coupled in parallel to provide capacitor 307. An example of a configuration of a bank of capacitors that may be used is a "finger" or "finger capacitors". A non-load side node of capacitor 306 may be coupled at node 311, and a non-load side node of capacitor 307 may be coupled at node 312.

When transistors 301 through 303 are all in an off state, capacitors 306 and 307 are generally decoupled from one another and from ground node 102, except for parasitic capacitive coupling as described below in additional detail. When transistors 301 through 303 are all in an on state, nodes 311 and 312 are pass-gate coupled to one another on non-load sides thereof and to ground node 102. Load or output nodes of capacitors 306 and 307 may respectively be coupled to positive-side output node 105 and negative-side output node 106, as illustratively depicted in FIG. 1. Basically when transistors 301 through 303 are all in an on state, node 311 and 312 are set to ground node 102, and so output nodes 106 and 105 each see a capacitor of $C_N$ to ground.

Capacitor unit cell 131 may have some parasitic capacitance, such as associated with transistors 301 through 303 in combination with MoM capacitors. Accordingly, capacitor 304 may not be an actual capacitor coupled between node 311 and ground node 102, and likewise capacitor 305 may not be an actual capacitor coupled between node 312 and ground node 102. Rather, capacitors 304 and 305 may be used to model parasitic capacitances associated with transistors 301 through 303 in combination with MoM capacitors. Thus, even when transistors 301 through 303 are all in an off state, a small parasitic capacitance of M2 and M3 between their drain and source regions persists. This small parasitic capacitance appears in series with substantially larger capacitances $C_N$ of capacitors 306 and 307. When a small capacitance appears in series with a large capacitance, the effective capacitance is smaller than the smallest of the two capacitances creating Cmin.

MoM capacitors 306 and 307 may be formed with deep Nwells to reduce parasitic capacitances generally associated with MOM capacitors, to reduce Cmin to maximize a Cmax/Cmin ratio to obtain a larger frequency tuning range. Generally, a deep Nwell is an Nwell implanted to a depth exceeding that of an inner Nwell thereof to isolate such inner Nwell from a p-type bulk substrate. A deep Nwell may be used to shield noise of a digital circuit from sensitivity of an analog circuit sharing a same p-type bulk substrate. Additionally, these coarse MOM capacitors 306 and 307 may be strategically placed to exploit a distributed LC nature of an LC tank oscillator to further increase such tuning range by not only minimizing Cmin but also tuning effective inductance Leff of such LC tank oscillator.

Returning to FIG. 1, varactor 140 may be used to provide a fine capacitance tuning network. However, for a FinFET or other MuGFET semiconductor process technology used to form an NMOS accumulation-mode varactor 140, there may be a higher threshold voltage, which conventionally may make an AC coupled NMOS varactor 140 limit an LC VCO tuning range.

However, frequency scaled resistor network 160 provides frequency dependent programmable resistor to adjust a bias voltage for varactor 140 in conjunction with a frequency dependent bias current to provide an NMOS LC VCO 100 with a wide tuning range. Such wideband NMOS LC VCO 100 may be provided with no degradation of an LC tank oscillator's quality factor Q. Such wideband NMOS LC VCO 100 may be provided with an improved loaded quality factor Q.

Such wide tuning range may be provided with a single NMOS LC VCO 100. This is to be contrasted with using two conventional LC VCOs to address tuning range to compensate for line rate. Moreover, such NMOS LC VCO 100 does not, and need not, include any AC bypass caps for varactor 140, which may lower a quality factor of an LC tank oscillator and/or which may reduce tuning range due to parasitic capacitances of a large AC coupling cap and/or capacitance division within varactor 140. Additionally, such NMOS LC VCO 100 does not, and need not, use a fixed control voltage 143 for varactor 140.

By having weighted PMOS current sources, such as described with reference to FIG. 2, LC tank oscillator swing may be roughly constant over an LC VCO 100 frequency range, including without limitation while LC VCO 100 is being tuned or operating. Varying Ibias 163 may affect common mode voltage of LC VCO 100, which common mode voltage may be equal to gate-to-source voltage ("Vgs") of cross-coupled NMOS transistors 151 and 152. Such common mode voltage may be roughly equal to $(\sqrt{(\beta*Ibias)}-Vt)$ where $\beta$ is a beta ratio associated with sizing of transistors 151 and 152, and Vt is generally an average threshold voltage of transistors 151 and 152.

Generally, for a low frequency of operation for LC VCO 100, namely when resistance Rp is low, Ibias 163 current is higher, and so an LC tank oscillator common mode voltage is higher and LC tank oscillator amplitude may remain constant. Generally, for a high frequency of operation for LC VCO 100, namely when resistance Rp is high, Ibias 163 current is lower, and so an LC tank oscillator common mode voltage is higher and LC tank oscillator amplitude may remain constant.

Figure 4:
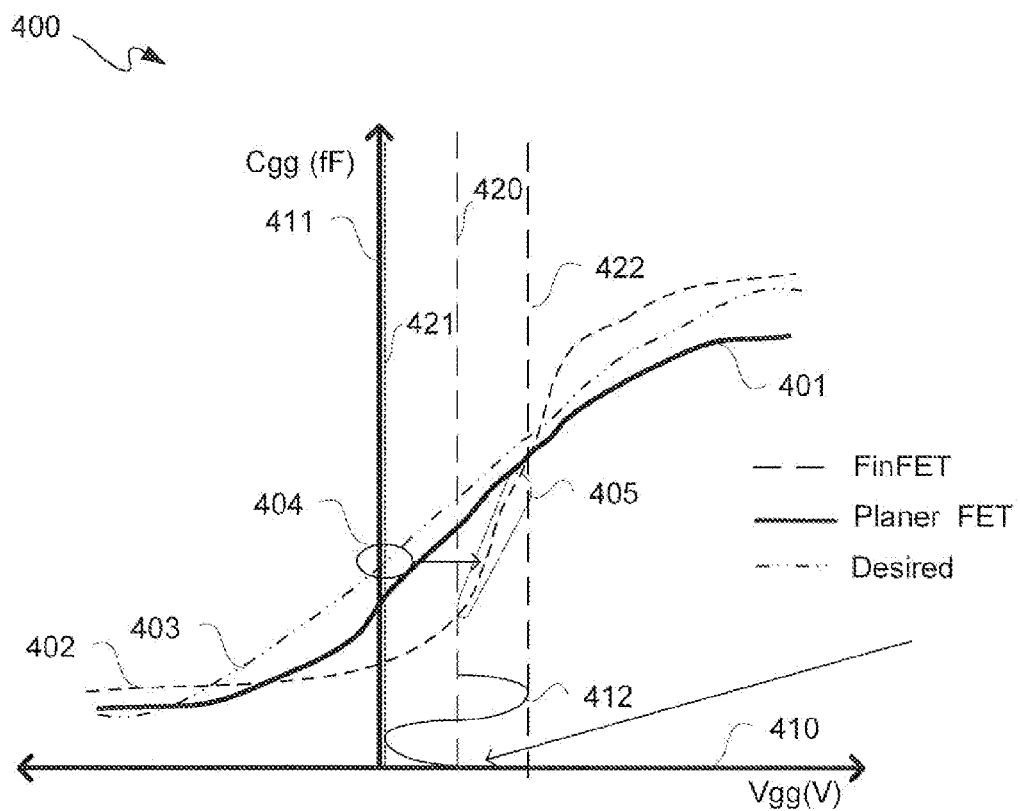
FIG. 4 is a plot diagram depicting exemplary capacitance-voltage ("CV") curves of accumulation varactors.

FIG. 4 is a plot diagram depicting an exemplary capacitance-voltage ("CV") curves 400 of NMOS accumulation varactors. CV curve 401 is a model curve of an accumulation-mode MOS varactor implemented using planar transistor technology. CV curve 402 is a model curve of an accumulation-mode MOS varactor implemented using a MuGFET, such as a FinFET, technology, such as varactor 140 of FIG. 1. CV curve 403 is a model curve for a desired or ideal varactor. As accumulation-mode MOS varactors are well-known, same not described in unnecessary detail herein.

CV curves 401 through 403 are plotted with an x-axis representing a gate bias or supply ("Vgg") voltage in volts (V) of a varactor and with a y-axis representing a gate capacitive load in femtofarads (fF) of such a varactor. Vgg may equal (Voutp/Voutn) less a varactor gate or control voltage, namely voltage on positive-side output node 105 divided by voltage on negative-side output node 106 minus control voltage 143.

Vgg of varactor 140 may be set to a common mode voltage ("Vcm") of LC VCO 100. In other words, Vcntrl 143 may be adjusted to a common mode voltage of LC VCO 100. Frequency tuning range of LC VCO 100 may be sensitive to Vcntrl 143, as Vcntrl 143 is set to Vcm.

CV curve 402 may shift due to FinFET semiconductor work function, as indicated by arrow 404. For example, an NMOS varactor 140 may be shifted to higher voltages due to MuGFET, such as FinFET, technology work function of such a varactor. This higher threshold voltage shift due to scaling may result in a higher slope for CV curve 402 in a region 405. Region 405 may be associated with an oscillator output or oscillating signal 412 of LC VCO 100, where oscillator output 412 is a sinusoidal signal oscillating about a central axis 420 to amplitudes generally associated with opposing axes 421 and 422 on either side of central axis 420. Moreover, a low transistor threshold voltage may mean that NMOS Vgs is likewise low, and so frequency tuning range may correspondingly be constrained. A marginal or overly constrained ("narrow") turning range may result in no frequency overlap over semiconductor process, voltage, and/or temperature ("PVT") variations. In other words, there may be significant frequency gaps, marginal ability to handle voltage variations, and/or marginal ability to handle temperature variations. To address one or more of these issues, a frequency scaled bias current source of programmable current source 110 and frequency scaled resistor network 160 of FIG. 1 may be used, where resistor network 160 is coupled to the tail of NMOS cross-coupled transconductance cell 150, namely coupled to source nodes of cross-coupled NMOS transistors 151 and 152.

With resistance R from frequency-scaled resistor network 160, control voltage 143 applied at a gate node of varactor 140 may be expressed as Vgs+Ibias*R. Both Ibias and R in this equation may be programmed responsive to frequency to provide a wideband tuning range and with less phase noise over an operating range of LC VCO 100.

Another benefit of adding resistance R at the tail node of cross-coupled transconductance cell 150 may be an improvement of loaded Q of an LC tank oscillator. Along those lines, effective impedance "looking" from an LC tank oscillator, such as LC VCO 100, toward ground 102 may be increased by resistance R.

To provide a wide frequency tuning range, LC VCO 100 may benefit from strategic placement of coarse MoM capacitors 306 and 307 of capacitor unit cells 131. Along those lines, placement of coarse MoM capacitors 306 and 307 of capacitor unit cells 131 in a layout may be used to maximize or otherwise substantially increase frequency tuning range by exploiting the distributed nature of inductor 120 to maximize or otherwise substantially increase LC tank oscillator frequency, which from Equation 1 it may be understood that fosc is inversely dependent upon Leff and Ceff. If all coarse MoM capacitors 306 and 307 of capacitor unit cells 131 are effectively switched out or off, a maximum LC tank oscillator frequency may be expressed as follows in Equation (3):

$$f_{osc}(\max)=1/(2\pi(L\min*C\min)^{1/2}), \quad (3)$$

where L and C in LC VCO 100 are minimized. If all coarse MoM capacitors 306 and 307 of capacitor unit cells 131 are effectively switched in or on, a minimum LC tank oscillator frequency may be expressed as follows in Equation (4):

$$f_{osc}(\min)=1/(2\pi(L\max*C\max)^{1/2}), \quad (4)$$

Figure 5:
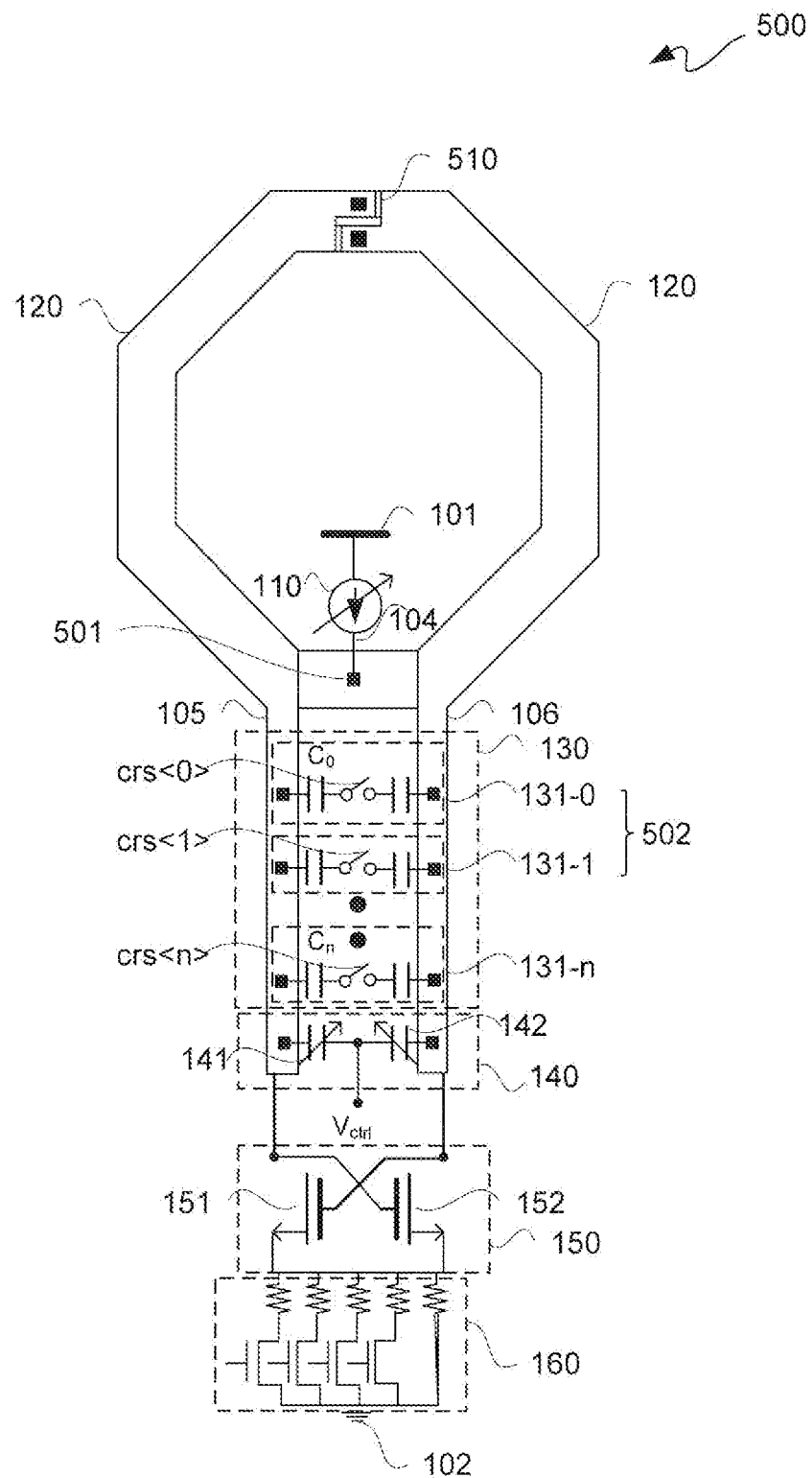
FIG. 5 is a layout diagram depicting an exemplary layout of a VCO.

FIG. 5 is a layout diagram depicting an exemplary layout 500 of an LC VCO 100. In this example, inductor 120 is an octagonal coil; however, in other implementations other configurations of inductor 120 may be used. As described below in additional detail, a layout is used to take advantage of distributed inductance to increase a frequency tuning range.

Programmable current source 110 may be coupled to a tap or node 501 of inductor 120 to provide Iout 104 thereto. For example, tap 501 may be a center tap, namely coupled to a center winding of coil 510. Positive-side output node 105 and negative-side output node 106 may be respective extensions of respective windings of coil 510, such as top and bottom windings or vice versa.

Each of capacitor unit cells 131 of coarse grain cap array 130 may be coupled to positive-side output node 105 and negative-side output node 106. These couplings to nodes 105 and 106 of capacitor unit cells 131 may have spacings 502 between them, which may or may not be uniform, to move some capacitances nearer to or further from coil 510, as described below in additional detail. However, generally cells 131 may be spaced apart from one another, and such cells 131 may be progressively spaced away from coil 510 of inductor 120.

For example, MoM capacitors 306 and 307 of each of capacitor unit cells 131 of coarse grain cap array 130 may respectively be coupled to positive-side output node 105 and negative-side output node 106. However, capacitance of each of capacitor unit cells 131 of coarse grain cap array 130 may be different from one another. Thus, for example, capacitance of capacitor unit cells 131-0 through 131-$n$ may respectively be $C_0$ through $C_n$, where $C_0 < C_1 < C_2 < C_3 \ldots < C_{n-2} < C_{n-1} < C_n$. In other words, capacitor unit cells 131 may be a successive progression of respective capacitances, where capacitance is increased for each higher order capacitor unit cell 131 in such progression up to a final capacitor unit cell 131 in such progression. The scale of such procession may be incremental, binary, or some other type of scaling. For purposes of clarity by way of example and not limitation, it shall be assumed that a binary scale is used, where capacitance of each higher order adjacent capacitor unit cells 131 is twice that of a nearest neighbor adjacent lower order capacitor unit cells 131, or $2C_0 = C_1, 2C_1 = C_2, \ldots, 2C_{n-2} = C_{n-1}$, and $2C_{n-1} = C_n$.

In this example, an LSB crs<0> is provided to capacitor unit cell 131-0; a next lowest SB crs<1> is provided to capacitor unit cell 131-1, and so on until an MSB crs<n> is provided to capacitor unit cell 131-$n$. In other words, progression of capacitances is such that the largest capacitance $C_n$ and associated capacitor bit crs<n> (MSB) of capacitor unit cell 131-$n$ is farther away from octagonal coil 510 than any other of such capacitances of such cells 131 of coarse grain cap array 130. Conversely, progression of capacitances is such that the smallest capacitance $C_0$ and associated capacitor bit crs<0> (LSB) of capacitor unit cell 131-0 is nearer to octagonal coil 510 than any other of such capacitances of such cells 131 of coarse grain cap array 130.

In this example, an LSB cell 131-0 is closest to coil 510 with respect to all other cells 131. Though other orientations of proximity of capacitances of cells 131 of array 130 with respect to coil 510 of inductor 120 may be used in other configurations, by having the above-described LSB to MSB nearest to farthest orientation with respect to coil 510, effective inductance Leff when a carrier frequency for communication is lowest, namely when all capacitors of array 130 are switched in or on to obtain Cmax as in Equation (4), a maximum effective inductance Lmax, as in Equation (4) may be obtained. Effective inductance L is maximized in LC VCO 100 according to Equation (5) as follows:

$$L\text{max} = Ld/2 + L\text{eff}_1 + L\text{eff}_2 + \ldots + L\text{eff}_{(n-1)}, \quad (5)$$

where Ld is a self d-phase or d-axis inductance of coil 510 of inductor 120, and where $L\text{eff}_1 + L\text{eff}_2 + \ldots + L\text{eff}_{(n-1)}$ is a series of effective inductances added up along either positive-side output node 105 or negative-side output node 106, such as previously described with reference to FIG. 1. This may result in a minimum LC tank oscillator frequency of LC VCO 100 as set forth in Equation (4).

Effective inductance L is minimized for an LC tank oscillator of LC VCO 100 when all of capacitor bits crs<0> through crs<n> are not asserted to cause all of capacitor cells 131-0 through 131-$n$ to be switched off. When all of such bits are turned off to have a Cmin for LC VCO 100, most RF current flow may be through an upper half of inductor coil 510. Along those lines, effective inductance L may be at minimum, namely Lmin, and Lmin may be approximately equal to Ld/2. In this state, a maximum LC tank oscillator frequency of LC VCO 100 may be as set forth in Equation (3).

Accordingly, by changing both capacitance C and effective inductance L to have a range from Cmax*Lmax to Cmin*Lmin, corresponding minimum and maximum frequencies may be obtained. Moreover, coarse values between Cmax*Lmax to Cmin*Lmin may be obtained by selectively turning on or off one or more of capacitor cells 131-0 through 131-$n$ such that at least one but not all of such capacitor cells 131-0 through 131-$n$ are switched in or on. Thus, range of coarse frequency control for a frequency tuning range with a minimum and a maximum respectively associated with Cmax*Lmax to Cmin*Lmin of an LC tank oscillator may be significantly increased. Such coarse frequency control may be provided by selectively switching in some, all, or none of capacitor cells 131-0 through 131-$n$ responsive to crs bits or signals.

In this example, array 130, as well as varactor 140 is coupled between nodes 105 and 106. Moreover, varactor 140 is coupled at ends of wires or traces used to provide nodes 105 and 106. Thus, varactor 140 is coupled further away from coil 510 than any of cells 131 of array 130.

A drain node of transistor 151 and a gate node of transistor 152 are commonly coupled to one another and coupled to an end of node 105, and a drain node of transistor 152 and a gate node of transistor 151 are commonly coupled to one another and coupled to an end of node 106. In this layout, cross-coupled transconductance cell 150 is coupled further away from coil 510 than is varactor 140. Moreover, in this layout, cross-coupled transconductance cell 150 is not coupled between nodes 105 and 106, but is outside of such area defined between nodes 105 and 106. Frequency scaled resistor network 160 is coupled to a common source node or resistance load node 107 of transistors 151 and 152 of cross-coupled transconductance cell 150, and in this layout, frequency scaled resistor network 160 is further from coil 510 than cross-coupled transconductance cell 150.

Swing and common mode control may be provided by using such crs bits or signals to selectively switch in some, all, or none of resistors R0 through RN. Thus, oscillator amplitude swing and common mode voltage may be scaled with frequency with a frequency dependent bias current and resistor bank.

Figure 6:
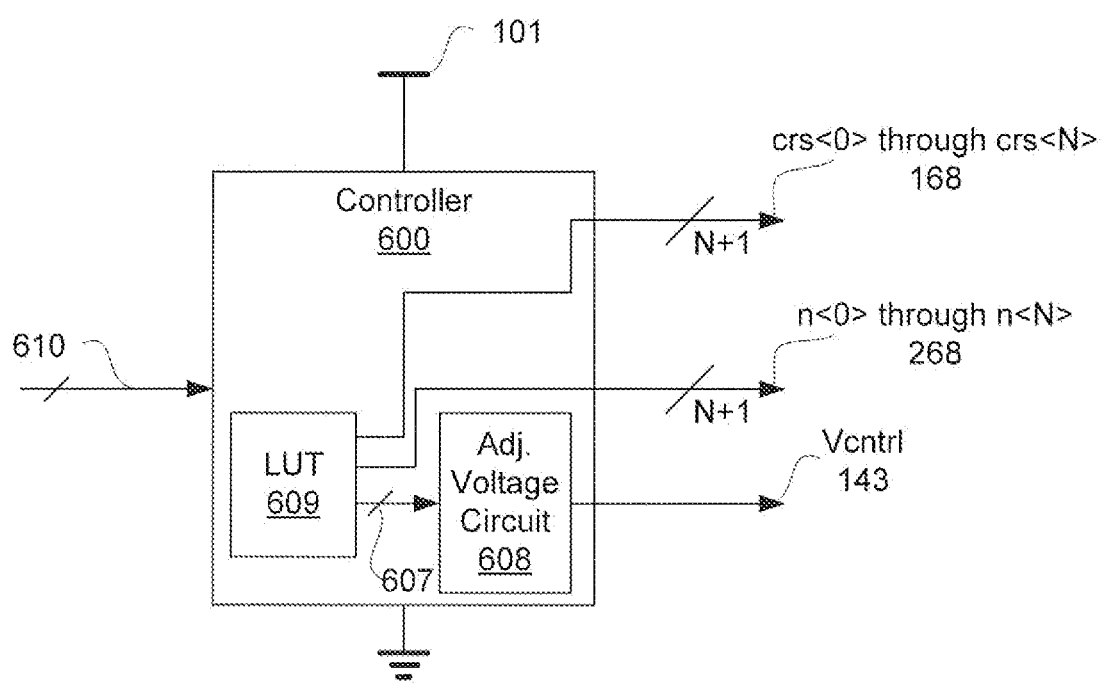
FIG. 6 is a block diagram depicting a controller.

FIG. 6 is a block diagram depicting a controller 600. Controller 600 may be implemented in programmable resources and/or dedicated logic. For purposes of clarity by way of example and not limitation, it shall be assumed that controller 600, as well as LC VCOs 100 are respectively implemented in phase-locked loops ("PLLs") of an integrated circuit device, such as an SoC (e.g., an FPGA), ASIC, multiprocessor chip, memory, or any other integrated circuit device having one or more PLLs. However, it should be understood that LC VCO 100 may be implemented in circuits other than PLLs. For purposes of clarity by way of example and not limitation, it shall be assumed that controller 600 and LC VCO 100 are implemented in an FPGA.

Controller 600 may receive a frequency and amplitude swing input signal 610. Input signal 610 may be at least one vector to one or more look-up tables ("LUT") 609 of controller 600. For a selected frequency and swing associated with such vector, a first set of selection signals 168, such as a set of bits crs<0> through crs<N> bits as described herein, a second set of selection signals 268, such as a set of bits n<0> through n<N> for programmable current source 110 as described herein, and a common mode voltage code 607 may be output from LUT 609 in response to such selection signal 610.

Sets of selection signals 168 and 268 respectively associated with sets of switches 278 and 288 may be provided as described herein to LC VCO 100 to provide a signal with a frequency and a swing selected responsive to input signal 610. Moreover, a common mode voltage code 607 may be provided to an adjustable voltage circuit 608 of controller 600. Adjustable voltage circuit 608 may provide a control voltage 143 in response to such common mode voltage code 607, where such common mode voltage code 607 stored in LUT 609 is associated with such selected frequency and swing.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 7:
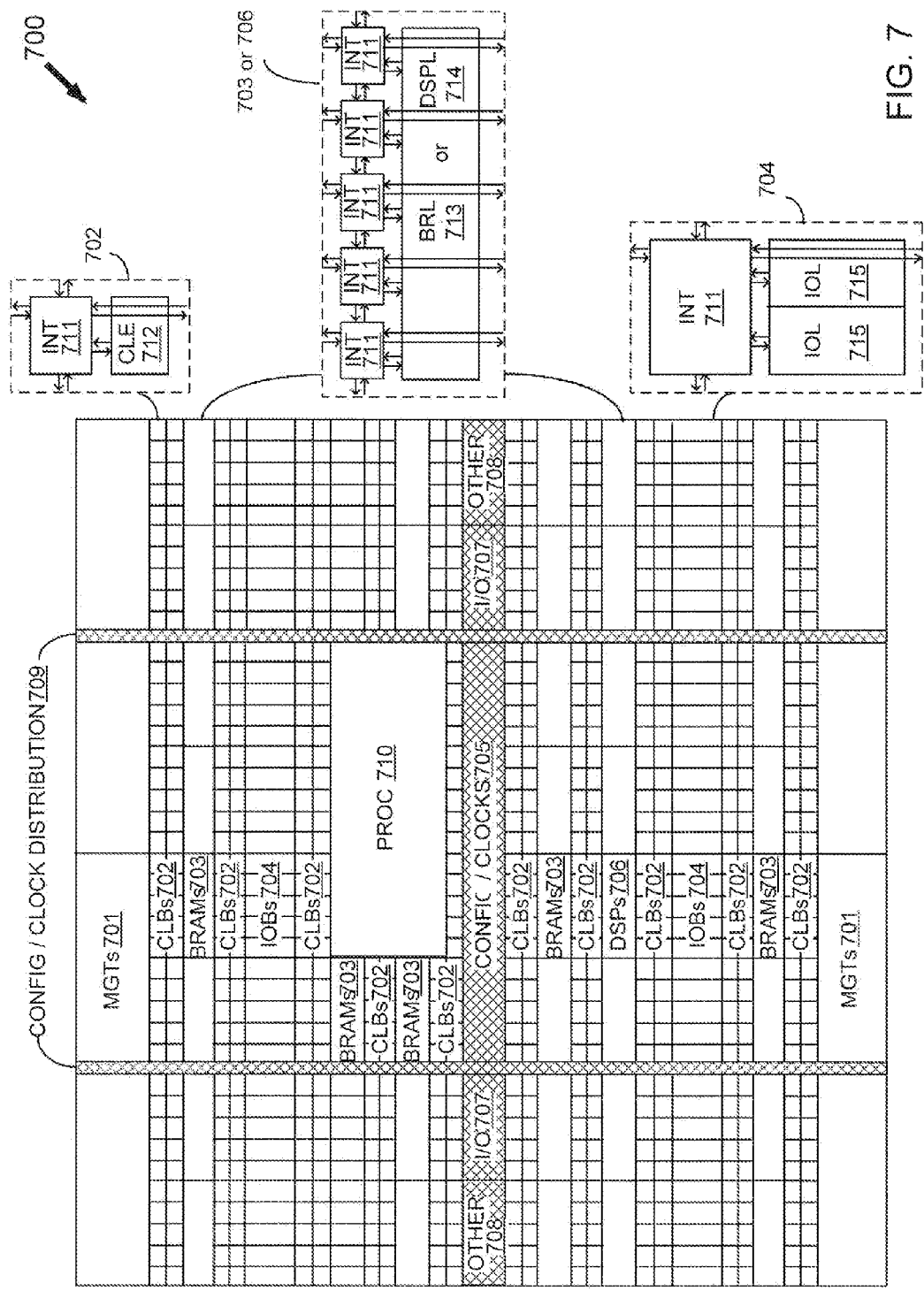
FIG. 7 is a simplified block diagram depicting an exemplary columnar Field Programmable Gate Array ("FPGA") architecture.

As noted above, advanced FPGAs can include several different types of programmable logic blocks in the array. For example, FIG. 7 illustrates an FPGA architecture 700 that includes a large number of different programmable tiles including multi-gigabit transceivers ("MGTs") 701, configurable logic blocks ("CLBs") 702, random access memory blocks ("BRAMs") 703, input/output blocks ("IOBs") 704, configuration and clocking logic ("CONFIG/CLOCKS") 705, digital signal processing blocks ("DSPs") 706, specialized input/output blocks ("I/O") 707 (e.g., configuration ports and clock ports), and other programmable logic 708 such as digital clock managers, analog-to-digital converters, system monitoring logic, and so forth. Some FPGAs also include dedicated processor blocks ("PROC") 710.

In some FPGAs, each programmable tile includes a programmable interconnect element ("INT") 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 can include a configurable logic element ("CLE") 712 that can be programmed to implement user logic plus a single programmable interconnect element ("INT") 711. A BRAM 703 can include a BRAM logic element ("BRL") 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element ("DSPL") 714 in addition to an appropriate number of programmable interconnect elements. An IOB 704 can include, for example, two instances of an input/output logic element ("IOL") 715 in addition to one instance of the programmable interconnect element 711. As will be clear to those of skill in the art, the actual I/O pads connected, for example, to the I/O logic element 715 typically are not confined to the area of the input/output logic element 715.

In the pictured embodiment, a horizontal area near the center of the die (shown in FIG. 7) is used for configuration, clock, and other control logic. Vertical columns 709 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 710 spans several columns of CLBs and BRAMs.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 8:
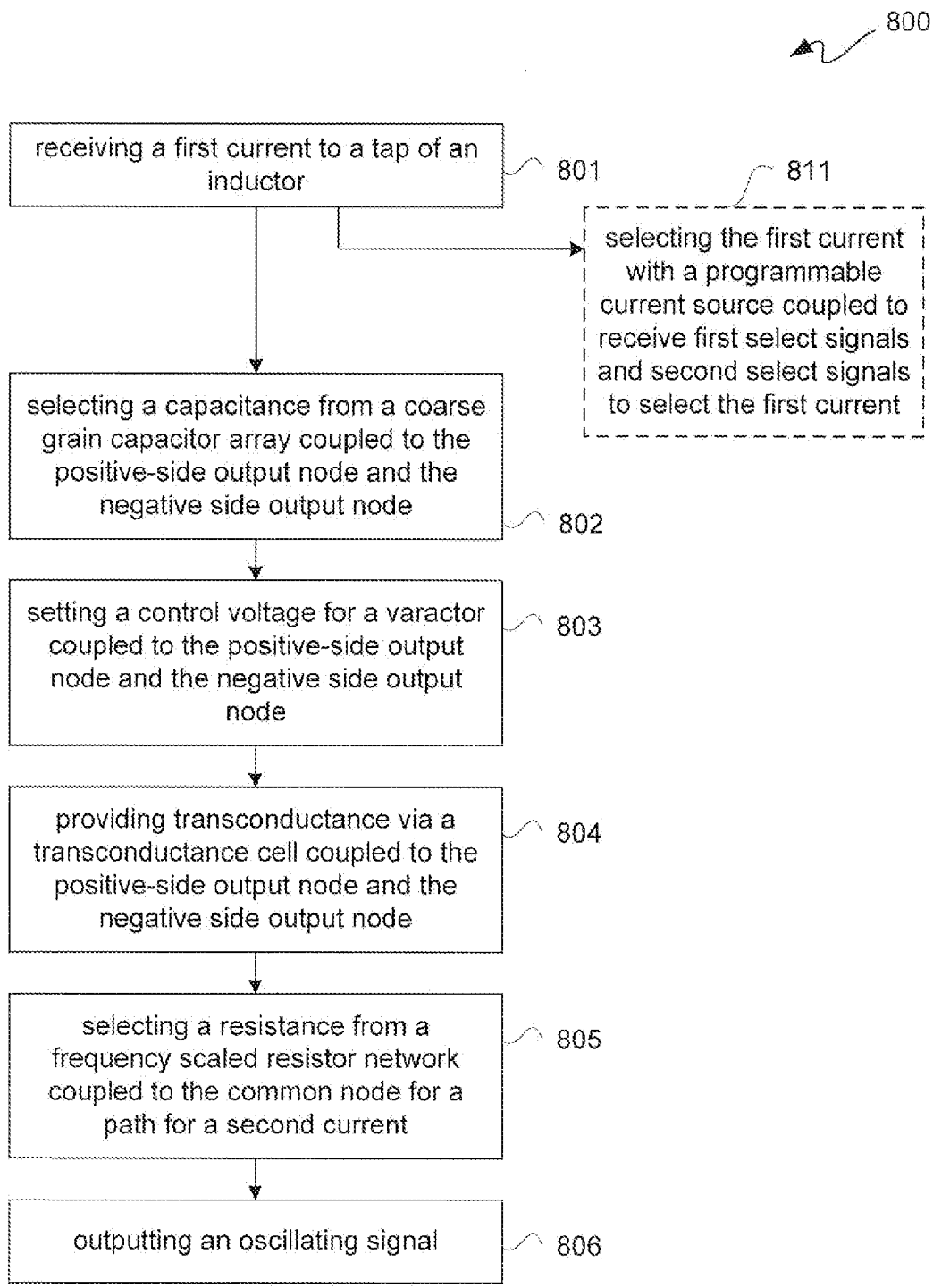
FIG. 8 is a flow diagram depicting an exemplary voltage controlled oscillation process.

FIG. 8 is a flow diagram depicting an exemplary voltage controlled oscillation process 800. Voltage controlled oscillation process 800 may be for LC VCO 100 to provide an oscillating signal 412 output, and accordingly voltage controlled oscillation process 800 is further described with simultaneous reference to FIGS. 1-6 and 8.

At 801 of such process 800, a first current, such as Iout 104, may be received to a tap of an inductor, such as tap 501 of inductor 120. Again, inductor 120 may be coupled to or have a positive-side output node 105 and a negative side output node 106. As part of 801, at 811 select signals 168 and 268 may be an option used for selecting such first current with a programmable current source 110 coupled to receive such select signals to select such first current. Programmable current source 110 may be coupled to a supply node 101, which may be a supply voltage node, to source such first current. Again, select signals 168 and 268 may be for opposite polarity transistors of programmable current source 110.

At 802, a capacitance may be selected from a coarse grain capacitor array 130 coupled to positive-side output node 105 and negative side output node 106. Again, cells 131 of coarse grain capacitor array 130 may be respectively coupled to receive select signals 168 to select such a capacitance.

At 803, a control voltage 143 may be set, such as by controller 600, for a varactor 140 coupled to positive-side output node 105 and negative side output node 106. At 804, transconductance may be provide via a transconductance cell, such as cross-coupled transconductance cell 150, coupled to positive-side output node 105 and negative side output node 106. Such cross-coupled transconductance cell 150 may have a common node, such as a common source node 107.

At 805, a resistance may be selected from a frequency scaled resistor network 160 coupled to such common node 107 for a path for a second current, such as Ibias current 163. Frequency scaled resistor network 160 may be coupled to receive select signals 168 to select such a resistance for such path to ground node 102. Along the above lines, at 806, an oscillating signal 412 may be output from LC VCO 100 with a frequency and an amplitude swing in accordance with selections and a controlled voltage setting as described above. Such frequency may be in a range, inclusive, of a wideband frequency tuning range of LC VCO 100.

To recapitulate, a voltage-controlled oscillator was described as having an inductor coupled to receive a first current to a tap thereof and coupled to or having a positive-side output node and a negative side output node. A coarse grain capacitor array is coupled to the positive-side output node and the negative side output node and coupled to respectively receive select signals. A varactor is coupled to the positive-side output node and the negative side output node and coupled to receive a control voltage, where the varactor includes first MuGFETs. A transconductance cell is coupled to the positive-side output node and the negative side output node and having a common node. A frequency scaled resistor network is coupled to the common node and coupled to receive the select signals for a resistance for a path for a second current.

In such a voltage-controlled oscillator as in the immediately preceding paragraph, the frequency scaled resistor network can include resistors coupled at respective first ends thereof to the common node with select transistors with drain nodes respectively thereof coupled to second ends of the resistors and with source nodes respectively thereof commonly coupled to one another, where gate nodes of the select transistors are respectively coupled to receive the select signals. The resistance of the path for the second current can be scalable with frequency in a frequency range of the voltage-controlled oscillator. The select transistors can include second MuGFETs. The second current can be a bias current for the voltage-controlled oscillator. Cells of the coarse grain capacitor array can be spaced apart from one another as coupled to the positive-side output node and the negative side output node. The cells can be progressively spaced away from a coil of the inductor. The cells can be coupled to respectively receive the select signals. The cells can be coupled from a least significant bit to a most significant bit with reference to the select signals. The least significant bit can be closest to the coil. Each of the cells can include: a first capacitor and a second capacitor; and a first transistor having a first gate coupled to receive a select signal of the select signals, a first source-drain node coupled to a first proximal conductor of the first capacitor, and a second source-drain node coupled to a second proximal conductor of the second capacitor. Each of the cells can include: a second transistor and a third transistor respectively having a second gate and a third gate commonly coupled to receive the select signal of the select signals; a first drain node of the second transistor coupled to the first source-drain node of the first transistor; a second drain node of the third transistor coupled to the second source-drain node of the first transistor; and respective source nodes of the second transistor and the third transistor commonly coupled to a ground node. The first transistor, the second transistor, and the third transistor can include second MuGFETs. A programmable current source can be coupled to a supply node to provide the first current, where the programmable current source can coupled to receive the select signals to respective select transistors thereof to provide a frequency scaled current source. The select transistors can be first select transistors associated with a first polarity. The programmable current source can be coupled to receive second select signals respectively to second select transistors thereof. The second select transistors can be associated with a second polarity opposite the first polarity. The first select transistors and the second select transistors of the programmable current source can be respective second MuGFETs.

To further recapitulate, a system for an integrated circuit device was described as having a controller coupled to receive a frequency and amplitude swing input signal. A voltage controlled oscillator is coupled to the controller to receive selection signals and a control voltage. The voltage controlled oscillator includes: an inductor coupled to receive a first current to a tap thereof and coupled to or having a positive-side output node and a negative side output node; a coarse grain capacitor array coupled to the positive-side output node and the negative side output node and coupled to respectively receive the select signals; a varactor coupled to the positive-side output node and the negative side output node and coupled to receive the control voltage, where the varactor includes first MuGFETs; a transconductance cell coupled to the positive-side output node and the negative side output node and having a common node; and a frequency scaled resistor network coupled to the common node and coupled to receive the select signals for resistance of a path for a second current.

In such a system as in the immediately preceding paragraph, a programmable current source can be coupled to a supply node to provide the first current, where the programmable current source can be coupled to receive the select signals to respective first select transistors thereof. The frequency scaled resistor network can include: resistors coupled at respective first ends thereof to the common node; and second select transistors with drain nodes respectively thereof coupled to second ends of the resistors and with source nodes respectively thereof commonly coupled to one another. Gate nodes of the second select transistors can be respectively coupled to receive the select signals. Cells of the coarse grain capacitor array can be spaced apart from one another as coupled to the positive-side output node and the negative side output node. The cells can be progressively spaced away from a coil of the inductor. Groups of third select transistors of the cells can be coupled to respectively receive the select signals. A resistance of the path for the second current can be scalable via the select signals provided to the frequency scaled resistor network to a frequency in a frequency range of the voltage controlled oscillator. The first select transistors can be associated with a first polarity; the select signals can be first select signals; the programmable current source can be coupled to receive second select signals respectively to fourth select transistors thereof; and the fourth select transistors can be associated with a second polarity opposite the first polarity. The first select transistors, the second select transistors, the third select transistors, and the fourth select transistors each respectively can include second MuGFETs.

To yet further recapitulate, a method for voltage-controlled oscillation was described as receiving a first current to a tap of an inductor, where the inductor is coupled to or has a positive-side output node and a negative side output node. A capacitance is selected from a coarse grain capacitor array coupled to the positive-side output node and the negative side output node, wherein the coarse grain capacitor array is coupled to respectively receive select signals to select the capacitance. A control voltage is set for a varactor coupled to the positive-side output node and the negative side output node, where the varactor includes MuGFETs. Transconductance is provided via a transconductance cell coupled to the positive-side output node and the negative side output node, where the transconductance cell has a common node. A resistance is selected from a frequency scaled resistor network coupled to the common node for a path for a second current. The frequency scaled bias current source-resistor network is coupled to receive the select signals to select the resistance for the path. An oscillating signal is output.

In such a method as in the immediately preceding paragraph, the select signals can be first select signals, and the first current can be selected with a programmable current source coupled to receive the first select signals and second select signals to select the first current. The programmable current source can be coupled to a supply node to source the first current. The first select signals and the second select signals can be for opposite polarity transistors of the programmable current source.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A voltage-controlled oscillator, comprising:
    an inductor having a tap and having or coupled to a positive-side output node and a negative side output node, wherein the tap is configured to receive a first current;
    a coarse grain capacitor array coupled to the positive-side output node and the negative side output node and configured to respectively receive select signals;
    a varactor coupled to the positive-side output node and the negative side output node and configured to receive a control voltage;
    wherein the varactor includes first MuGFETs;
    a transconductance cell coupled to the positive-side output node and the negative side output node and having a common node; and
    a frequency scaled resistor network coupled to the common node and configured to receive the select signals for a resistance for a path for a second current;
    wherein:
        cells of the coarse grain capacitor array are spaced apart from one another as coupled to the positive-side output node and the negative side output node;
        the cells are progressively spaced away from a coil of the inductor; and
        the cells are configured to respectively receive the select signals.

2. The voltage-controlled oscillator according to claim 1, wherein the frequency scaled resistor network comprises:
    resistors having respective first ends and second ends, wherein the first ends are coupled to the common node;
    select transistors with gate nodes, drain nodes and source nodes;
    wherein the drain nodes are respectively coupled to the second ends of the resistors;
    wherein the source nodes are respectively commonly coupled to one another; and
    wherein the gate nodes of the select transistors are respectively configured to receive the select signals.

3. The voltage-controlled oscillator according to claim 2, wherein:
    the resistance of the path for the second current is scalable with frequency in a frequency range of the voltage-controlled oscillator;
    the select transistors include second MuGFETs; and
    the second current is a bias current for the voltage-controlled oscillator.

4. The voltage-controlled oscillator according to claim 1, wherein:
    the cells are coupled from a least significant bit to a most significant bit with reference to the select signals; and
    the least significant bit is closest to the coil.

5. The voltage-controlled oscillator according to claim 1, wherein each of the cells comprises:
    a first capacitor and a second capacitor; and
    a first transistor having a first gate configured to receive a select signal of the select signals, a first source-drain node coupled to a first proximal conductor of the first capacitor, and a second source-drain node coupled to a second proximal conductor of the second capacitor.

6. The voltage-controlled oscillator according to claim 5, wherein each of the cells comprises:
- a second transistor and a third transistor respectively having a second gate and a third gate commonly configured to receive the select signal of the select signals;
- a first drain node of the second transistor coupled to the first source-drain node of the first transistor;
- a second drain node of the third transistor coupled to the second source-drain node of the first transistor; and
- respective source nodes of the second transistor and the third transistor commonly coupled to a ground node.

7. The voltage-controlled oscillator according to claim 6, wherein the first transistor, the second transistor, and the third transistor comprise second MuGFETs.

8. The voltage-controlled oscillator according to claim 1, further comprising:
- a programmable current source coupled to a supply node and configured to provide the first current;
- wherein the programmable current source includes select transistors; and
- wherein the select transistors are respectively configured to receive the select signals and configured to provide a frequency scaled current source.

9. The voltage-controlled oscillator according to claim 8, wherein:
- the select transistors are first select transistors associated with a first polarity;
- the programmable current source includes second select transistors, wherein the second select transistors are configured to respectively receive second select signals; and
- the second select transistors are associated with a second polarity opposite the first polarity.

10. The voltage-controlled oscillator according to claim 9, wherein the first select transistors and the second select transistors of the programmable current source are respective second MuGFETs.

11. A system for an integrated circuit device, comprising:
- a controller configured to receive a frequency and amplitude swing input signal; and
- a voltage controlled oscillator coupled to the controller and configured to receive selection signals and a control voltage;
- wherein the voltage controlled oscillator comprises:
  - an inductor having a tap and having or coupled to a positive-side output node and a negative side output node, wherein the tap is configured to receive a first current;
  - a coarse grain capacitor array coupled to the positive-side output node and the negative side output node and configured to respectively receive the select signals;
  - a varactor coupled to the positive-side output node and the negative side output node and configured to receive the control voltage, wherein the varactor includes first MuGFETs;
  - a transconductance cell coupled to the positive-side output node and the negative side output node and having a common node; and
  - a frequency scaled resistor network coupled to the common node and configured to receive the select signals for resistance of a path for a second current;
- wherein:
  - cells of the coarse grain capacitor array are spaced apart from one another as coupled to the positive-side output node and the negative side output node;
  - the cells are progressively spaced away from a coil of the inductor; and
  - groups of select transistors of the cells are configured to respectively receive the select signals.

12. The system according to claim 11, wherein the select transistors are first select transistors, the system further comprising:
- a programmable current source coupled to a supply node and configured to provide the first current;
- wherein the programmable current source includes second select transistors; and
- wherein the second select transistors are configured to receive the select signals.

13. The system according to claim 12, wherein the frequency scaled resistor network comprises:
- resistors having first ends, wherein the first ends are coupled to the common node; and
- third select transistors including source nodes, gate nodes, and drain nodes;
- wherein the drain nodes of the third select transistors are respectively coupled to second ends of the resistors;
- wherein the source nodes of the third select transistors are commonly coupled to one another; and
- wherein the gate nodes of the third select transistors are respectively configured to receive the select signals.

14. The system according to claim 13, wherein a resistance of the path for the second current is scalable via the select signals provided to the frequency scaled resistor network to a frequency in a frequency range of the voltage controlled oscillator.

15. The system according to claim 14, wherein
- the second select transistors are associated with a first polarity;
- the select signals are first select signals;
- the programmable current source includes fourth select transistors, wherein the fourth select transistors are respectively configured to receive second select signals; and
- the fourth select transistors are associated with a second polarity opposite the first polarity.

16. The system according to claim 15, wherein the first select transistors, the second select transistors, the third select transistors, and the fourth select transistors each respectively comprise second MuGFETs.

17. A method for voltage controlled oscillation, comprising:
- receiving a first current to a tap of an inductor;
- wherein the inductor is coupled to or has a positive-side output node and a negative side output node;
- selecting a capacitance from a coarse grain capacitor array coupled to the positive-side output node and the negative side output node;
- wherein the coarse grain capacitor array is configured to respectively receive select signals to select the capacitance;
- wherein:
  - cells of the coarse grain capacitor array are spaced apart from one another as coupled to the positive-side output node and the negative side output node; and
  - the cells are progressively spaced away from a coil of the inductor;
- respectively receiving the select signals by groups of select transistors of the cells to select the capacitance;
- setting a control voltage for a varactor coupled to the positive-side output node and the negative side output node;
- wherein the varactor includes MuGFETs;

providing transconductance via a transconductance cell coupled to the positive-side output node and the negative side output node;

wherein the transconductance cell has a common node;

selecting a resistance from a frequency scaled resistor network coupled to the common node for a path for a second current;

wherein the frequency scaled bias current source-resistor network is configured to receive the select signals to select the resistance for the path; and outputting an oscillating signal.

18. The method according to claim 17, wherein the select signals are first select signals, the method further comprising:

selecting the first current with a programmable current source configured to receive the first select signals and second select signals to select the first current;

wherein the programmable current source is coupled to a supply node to source the first current; and wherein the first select signals and the second select signals are for opposite polarity transistors of the programmable current source.

* * * * *